(12) United States Patent
Ziberna

(10) Patent No.: US 7,518,880 B1
(45) Date of Patent: Apr. 14, 2009

(54) SHIELDING ARRANGEMENT FOR ELECTRONIC DEVICE

(75) Inventor: Frank J. Ziberna, Elmhurst, IL (US)

(73) Assignee: Bi-Link, Bloomingdale, IL (US)

( * ) Notice: Subject to any disclaimer, the term of this patent is extended or adjusted under 35 U.S.C. 154(b) by 0 days.

(21) Appl. No.: 11/702,729

(22) Filed: Feb. 6, 2007

Related U.S. Application Data

(60) Provisional application No. 60/771,247, filed on Feb. 8, 2006.

(51) Int. Cl.
*H05K 1/14* (2006.01)
(52) U.S. Cl. .............. 361/737; 361/753; 361/799; 361/800; 361/816; 361/818; 174/350; 174/351
(58) Field of Classification Search ............. 361/737, 361/753, 799, 800, 816, 818; 174/350, 351; 438/106, 121
See application file for complete search history.

(56) References Cited

U.S. PATENT DOCUMENTS

| | | | |
|---|---|---|---|
| 4,022,928 A | 5/1977 | Piwcyzk | |
| 4,218,578 A | 8/1980 | Olschewski et al. | |
| 4,306,515 A | 12/1981 | Winkler | |
| 4,612,206 A | 9/1986 | Shimozato et al. | |
| 4,643,131 A | 2/1987 | Umeda et al. | |
| 4,674,443 A | 6/1987 | Furukawa et al. | |
| 4,714,905 A * | 12/1987 | Bernstein et al. ............. 333/167 | |
| 4,777,908 A | 10/1988 | Temple et al. | |
| 4,829,432 A | 5/1989 | Hershberger et al. | |
| 4,890,199 A | 12/1989 | Beutler | |
| 5,045,973 A | 9/1991 | Saarela et al. | |
| 5,150,282 A | 9/1992 | Tomura et al. | |
| 5,205,091 A * | 4/1993 | Brown ......................... 52/126.6 | |
| 5,242,310 A | 9/1993 | Leung | |
| 5,252,782 A | 10/1993 | Cantrell et al. | |
| 5,330,363 A | 7/1994 | Gardner et al. | |
| 5,339,222 A | 8/1994 | Simmons et al. | |
| 5,397,857 A | 3/1995 | Farquhar et al. | |
| 5,413,490 A | 5/1995 | Tan et al. | |
| 5,436,802 A | 7/1995 | Trahan et al. | |
| 5,456,610 A | 10/1995 | Banakis et al. | |
| 5,473,111 A | 12/1995 | Hattori et al. | |
| 5,478,260 A | 12/1995 | Kaufman et al. | |
| 5,500,628 A * | 3/1996 | Knecht ......................... 331/68 |
| 5,508,889 A | 4/1996 | Li | |
| 5,510,959 A * | 4/1996 | Derstine et al. ............. 361/816 |
| 5,572,408 A * | 11/1996 | Anhalt et al. ................ 361/737 |
| 5,574,628 A * | 11/1996 | Persia et al. ................. 361/737 |
| 5,586,222 A | 12/1996 | Mosquera | |
| 5,614,694 A | 3/1997 | Gorenz, Jr. et al. | |

(Continued)

*Primary Examiner*—Dean A. Reichard
*Assistant Examiner*—Xiaoliang Chen
(74) *Attorney, Agent, or Firm*—Erickson Law Group, PC

(57) ABSTRACT

A shielding arrangement for an electronic component mounted on a circuit board includes a shield formed by a frame sidewall arranged to be oriented upstanding from the circuit board and surrounding the electronic component mounted on the circuit board. A first cover portion substantially closes the surrounding sidewall, enclosing the electronic component on the circuit board. A conductive layer, formed by vacuum deposition covers an inside surface of the surrounding sidewall and an inside surface of the first cover portion, continuously. As an alternative to the conductive layer, the frame can be composed of an electrically conductive plastic. The first cover portion can be a stamped metal plate integrated with the frame by overmolding.

11 Claims, 7 Drawing Sheets

U.S. PATENT DOCUMENTS

| | | | |
|---|---|---|---|
| 5,633,786 | A | 5/1997 | Matuszewski et al. |
| 5,726,867 | A * | 3/1998 | Zarreii ................. 361/818 |
| 5,783,857 | A * | 7/1998 | Ziegner et al. ............ 257/664 |
| RE35,873 | E * | 8/1998 | Simmons et al. ............ 361/818 |
| 5,804,870 | A * | 9/1998 | Burns ................. 257/666 |
| 5,847,317 | A * | 12/1998 | Phelps ................. 174/368 |
| 5,872,332 | A | 2/1999 | Verma |
| 6,004,144 | A | 12/1999 | Yeh et al. |
| 6,028,497 | A * | 2/2000 | Allen et al. ............ 333/246 |
| 6,051,779 | A | 4/2000 | Gammon |
| 6,088,231 | A * | 7/2000 | Fajardo ................. 361/737 |
| 6,096,413 | A | 8/2000 | Kalinoski et al. |
| 6,104,620 | A * | 8/2000 | Dudas et al. ............ 361/800 |
| 6,128,195 | A * | 10/2000 | Weber et al. ............ 361/737 |
| 6,136,131 | A | 10/2000 | Sosnowski |
| 6,169,666 | B1 | 1/2001 | Venant |
| 6,175,077 | B1 | 1/2001 | Mendolia et al. |
| 6,178,097 | B1 | 1/2001 | Hauk, Jr. |
| 6,180,876 | B1 | 1/2001 | Holmes |
| 6,204,480 | B1 | 3/2001 | Woodard et al. |
| 6,229,249 | B1 * | 5/2001 | Hatanaka et al. ............ 310/348 |
| 6,229,404 | B1 * | 5/2001 | Hatanaka ................. 331/68 |
| 6,269,537 | B1 | 8/2001 | Kimura et al. |
| 6,274,014 | B1 | 8/2001 | Matsumoto et al. |
| 6,313,400 | B1 * | 11/2001 | Mosquera et al. ............ 174/363 |
| 6,331,349 | B1 | 12/2001 | Kalinoski et al. |
| 6,377,472 | B1 | 4/2002 | Fan |
| 6,420,649 | B1 | 7/2002 | Kahl et al. |
| 6,426,881 | B1 | 7/2002 | Kurz |
| 6,474,998 | B1 | 11/2002 | Takeuchi |
| 6,501,016 | B1 | 12/2002 | Sosnowski |
| 6,509,807 | B1 * | 1/2003 | Anthony et al. ............ 333/12 |
| 6,515,222 | B2 | 2/2003 | Underwood et al. |
| 6,552,261 | B2 | 4/2003 | Shlahtichman et al. |
| 6,641,409 | B1 | 11/2003 | Gu |
| 6,824,969 | B1 | 11/2004 | Ko |
| 6,855,236 | B2 | 2/2005 | Sato et al. |
| 6,908,038 | B1 | 6/2005 | Le |
| 2002/0067591 | A1 * | 6/2002 | Tajima ................. 361/681 |
| 2002/0090761 | A1 * | 7/2002 | Goldmann et al. ............ 438/124 |
| 2003/0161109 | A1 * | 8/2003 | Kurihara et al. ............ 361/709 |
| 2004/0017673 | A1 * | 1/2004 | Chao ................. 361/800 |
| 2004/0056205 | A1 * | 3/2004 | Caruba et al. ............ 250/370.15 |
| 2005/0083447 | A1 * | 4/2005 | Yu ................. 349/58 |
| 2006/0060953 | A1 * | 3/2006 | Yang et al. ............ 257/678 |
| 2006/0084289 | A1 * | 4/2006 | Ziberna ................. 439/67 |
| 2006/0109639 | A1 * | 5/2006 | Nakano ................. 361/818 |
| 2007/0023896 | A1 * | 2/2007 | Dangelmaier et al. ....... 257/728 |

* cited by examiner

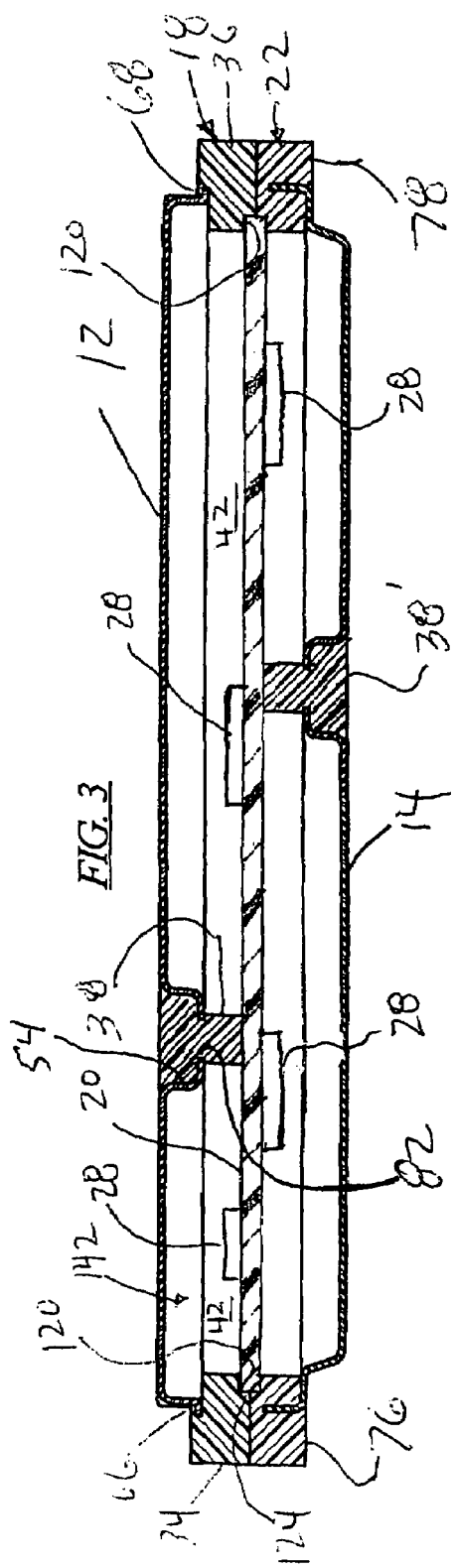
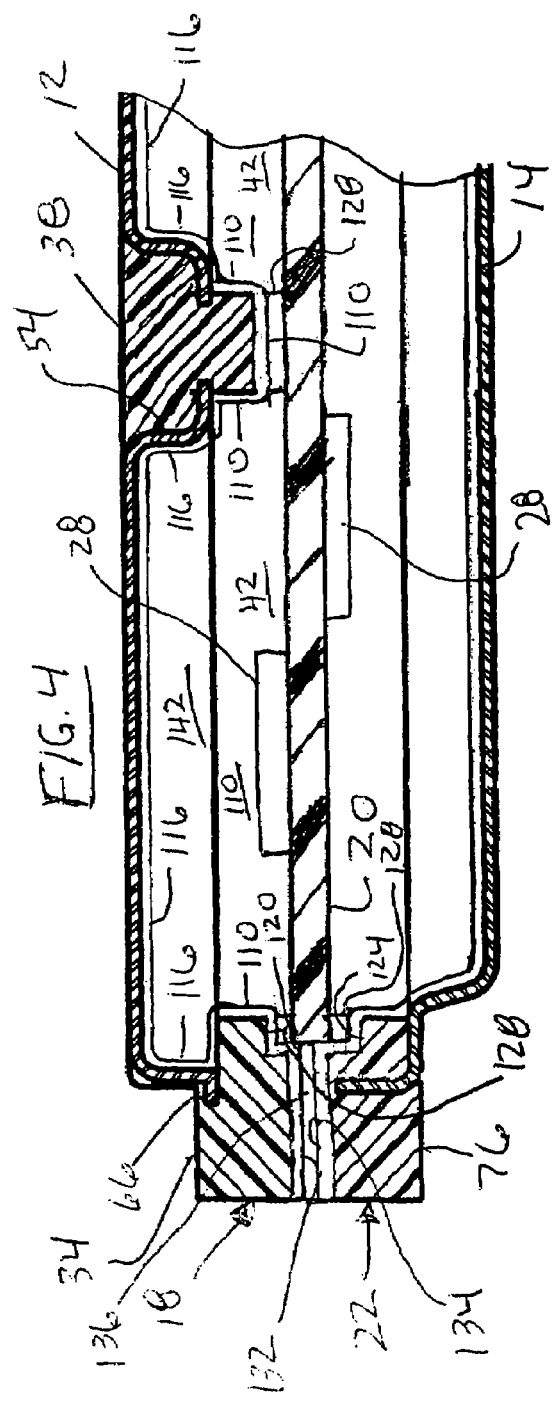

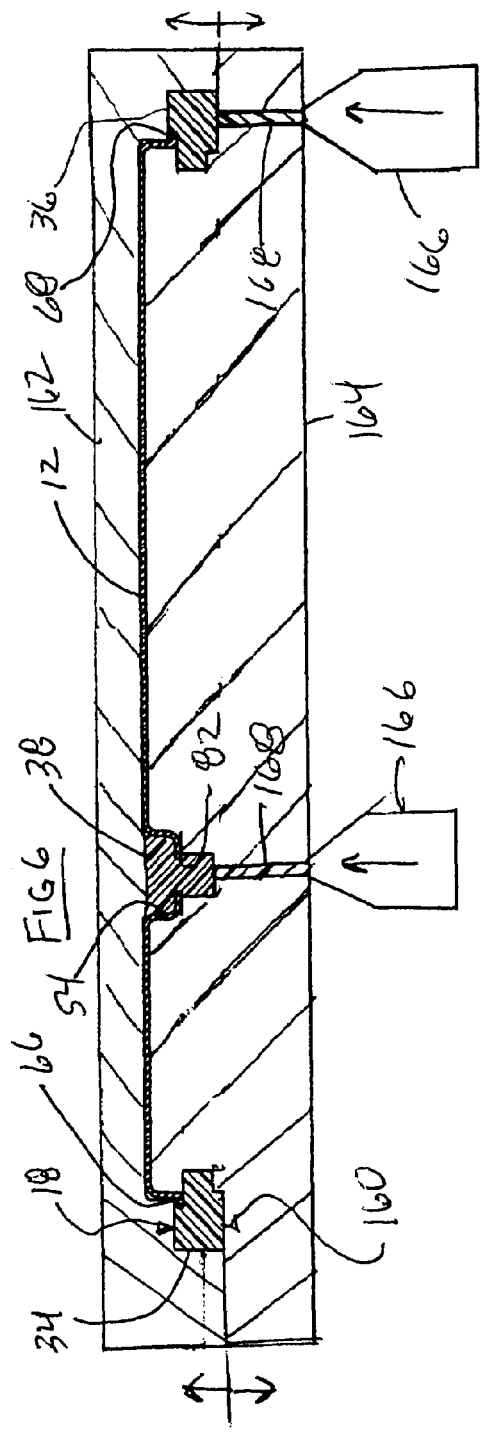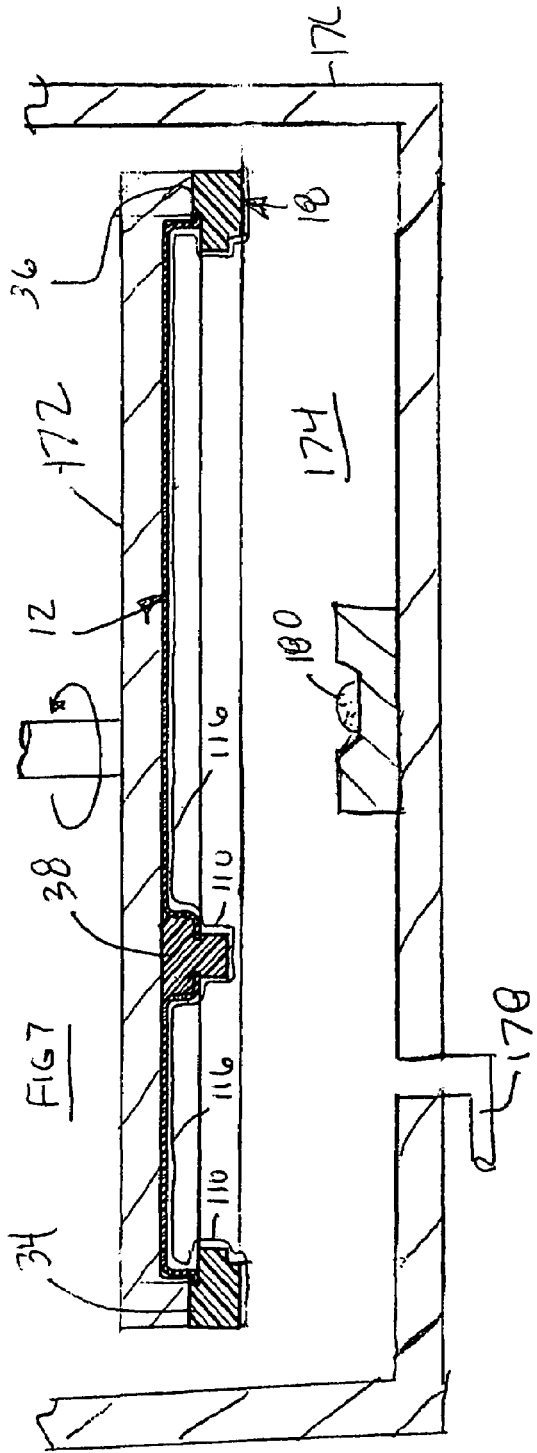

SHIELDING ARRANGEMENT FOR ELECTRONIC DEVICE

This application claims the benefit of U.S. Provisional Application 60/771,247 filed Feb. 8, 2006.

TECHNICAL FIELD OF THE INVENTION

The present invention relates generally to shielding of electronic components and particularly to shielding of memory media and I/O device containers, and more particularly to shielding of a casing for printed circuit boards that conforms to standards set by PCMCIA, JEDIC, ISO, etc. for peripheral devices.

BACKGROUND OF THE INVENTION

As computing devices are reduced in size, there is reduced available space for storage devices such as a hard disk drive or an I/O device. In order to expand a portable, laptop, or any other type of computer's capacity and functioning capability, manufacturers have devised "plug-in" peripheral cards in the form of printed circuit boards contained within an exterior casing. The Personal Computer Memory Card International Association (PCMCIA) and comparable organizations have established certain size and shape standards for the construction of the peripheral cards. These peripheral cards including associated casings are termed "PCMCIA" style peripheral devices.

The PCMCIA style devices can be used to perform the functions of software, resident memory in hardware devices, or as a hard drive. The devices can be used to facilitate LAN networking and wireless networking, as flash memory, as paging devices, and as FAX modems. They may be used in cellular telephones, PROMS, EPROMS, EEPROMS, RAMS, SRAMS, and DRAMS. The devices can be used in the form of IC cards or memory cards and as I/O cards for computer communication systems.

A conventional PCMCIA style device comprises a pair of metallic top and bottom covers configured to be engaged together, a supporting frame, a circuit board, with mounted electronic components, mounted on the frame, and primary and sometimes secondary electrical connectors. The primary connector is typically referred to as an "I/O" connector. The primary connector is provided on one end of the device for interfacing the memory card, and particularly the printed circuit board contained within the PCMCIA style device, to the outside device to which the PCMCIA style device is mated. The primary connector is designed to extract the contents of the memory stored on the printed circuit board and to bus data to and from an outside device, such as a computer or other electronic device. In this fashion, data traverses the interface between the PCMCIA style device and the outside device so that the data can be efficiently transferred and used by the outside device to which the PCMCIA style device is mated for its intended purpose. In one typical assembly, the circuit board is equipped with the primary and secondary connectors at opposite ends thereof and then attached to the supporting frame before being sandwiched between the top and bottom metallic covers.

At the present time, there are three different PCMCIA style device types, as defined by PCMCIA. The three PC card types are as follows:

a. Type I PC Cards are 54 mm by 85.6 mm, by 3.3 mm (0.130") thick.

b. Type II PC Cards are 54 mm by 85.6 mm by 5 mm (0.195") thick. The raised substrate areas of these cards are 48 mm in width.

c. Type III PC Cards are 54 mm by 85.6 mm with a substrate area thickness of 10.5 mm, and a card guide opening width requirement of 51 mm of the header connector to accommodate the slightly raised substrate area.

A new peripheral card named EXPRESS 34 has been proposed. In addition to the characteristics of the PCMCIA style device, the new peripheral card offers key advantages in terms of faster speed and smaller size. So, devices which connect the EXPRESS 34 and the PCI Express interfaces in notebook computers must have low profile interconnection and also meet the signal integrity requirement of PCI Express.

Examples of peripheral cards are described in U.S. Pat. Nos. 6,824,969; 5,397,857; 5,397,857; 6,004,144 and 6,474,998.

It is well known that electronic signals within electronic packages emit electromagnetic energy from the package, which causes electromagnetic interference (EMI) in other electric signals. It is desired to provide a complete and efficient shielding against the emission of EMI. On the other hand, electrostatic discharge (ESD) is also another important issue because electronic components are also very sensitive to ESD and special care must be taken in handling. Radio Frequency (RF) interference can also be a problem. However, if the package is properly shielded by a conductive material, it will serve to reduce EMI, RF and ESD problems.

FIG. 8 illustrates in section a prior art electronic device, in the form of a PCMCIA style device. When an electronic component 2 mounted on a card 3 must be shielded by a shield 4, the thickness of the shield 4 and any necessary vertical clearance between the shield 4 and a device cover 5 reduces valuable vertical usable space within the device. Additionally, the sidewalls of the shield 4 reduce lateral usable space within the device.

Given the strict thickness limitations of the aforementioned types of electronic devices, and given the desirability of fitting more components and more complex components into electronic devices, the present inventor has recognized the desirability of maximizing the usable inside volume of an electronic device by increasing the usable thickness of an electronic device for working components within the electronic device.

SUMMARY OF THE INVENTION

The invention provides an advantageous, space saving shielding arrangement for an electronic component mounted on a circuit board. Although the invention is particularly suited for peripheral devices, such as PC cards, aspects of the invention could also be incorporated generally into the design of shielding for any electronic components mounted on circuit boards. The shielding arrangement of the invention includes a sidewall composed of a plastic or polymer material oriented to be upstanding from the circuit board and surrounding the electronic component to be shielded that is mounted on the circuit board. A first cover portion substantially closes the surrounding sidewall, forming a chamber and enclosing the electronic component on the circuit board.

According to one embodiment of the invention, an electrically conductive sidewall layer or film covers an inside surface of the sidewall. Preferably, a cover portion electrically conductive layer or film also covers an inside surface of the first cover portion in a smoothly continuous fashion with the sidewall conductive layer. Thus, the entire inside surface of the chamber is covered by a conductive layer and the electronic component is shielded.

According to an exemplary embodiment, the first cover portion comprises a stamped metal plate, although a plastic or polymer plate, or other material plate is also encompassed by the invention. The continuous conductive layer comprising the sidewall conductive layer and the cover portion conductive layer increases the effective shielding whether or not the first cover portion is a conductive metal plate or a nonconductive plastic plate.

According to another aspect of the invention, when the first cover portion comprises a stamped metal plate, the sidewall is integrally molded with, or over molded on, the metal plate. In this regard, the stamped metal plate can have a plurality of holes therethrough, and the sidewall is molded through the holes to integrate the metal plate to the sidewall.

The invention disclosure provides an effective method of manufacturing a shield for an electronic component. The method includes the steps of: providing an enclosure having a surrounding sidewall and a first cover portion; and depositing a layer of electrically conductive material on at least an inside surface of the sidewall.

The step of depositing can be further defined in that the layer is deposited continuously on both the inside surface of the sidewall and on an inside surface of the first cover portion to effectively cover the entire inside surface of the enclosure.

Also, according to an exemplary method of the invention, the step of depositing the electrically conductive layer is a metal vacuum deposition method. According to such a method, the steps include: placing the enclosure into a chamber; arranging a supply of a metal within the chamber; heating the supply of the metal; evacuating the chamber; and depositing the conductive layer continuously on the inside surface of the surrounding sidewall and an inside surface of the first cover portion.

According to an exemplary method, the step of providing an enclosure is further defined by the steps of: providing a stamped metal plate; inserting the stamped metal plate into a mold; injecting molten polymer or plastic into the mold to form the surrounding sidewall; allowing the molten polymer or plastic to harden to integrate the sidewall with the stamped metal plate.

Once the frame and first cover portion are integrated and the conductive layer is applied to the frame and the first cover portion, the frame and the first cover portion can be applied to a circuit board in accordance with another advantageous aspect of the preferred method of the invention. The method includes the steps of: arranging a conductive adhesive continuously between facing surfaces of the sidewall and the circuit board; placing the enclosure onto the circuit board; and allowing the adhesive to cure to fix the enclosure to the circuit board.

One aspect of the invention includes the provision of a complete electronic device. The electronic device includes a circuit board and an electronic component, such as an integrated circuit or computer chip, mounted to the printed circuit board, a first frame, a first cover portion carried by the first frame, a second frame, and a second cover portion carried by the second frame. Particularly, the electronic component is mounted to a first side of the circuit board. The first frame is composed of a plastic or polymer material and secured around its perimeter to the first side of the circuit board. The first frame comprises a plurality of longitudinally arranged rails and laterally arranged rails defining at least one closed perimeter in the plane of the circuit board that surrounds the electronic component on the circuit board. The first cover portion carried by the first frame closes at least one closed perimeter to form a chamber. A layer of conductive material is adhered to and covers an inside surface of the chamber. The second frame is secured around its perimeter to an opposite side of the printed circuit board, and comprises a plurality of longitudinally extended rails and laterally extending rails partly defining a perimeter of the second frame. The second cover portion carried by the second frame closes the bottom frame.

Preferably, the first cover portion is composed of a conductive material.

Preferably, the first frame is adhesively secured to the first side of the circuit board with electrically conductive adhesive.

Preferably, the first frame comprises a plurality of closed perimeters in the plane of the circuit board, each of which surrounds one or more electronic components mounted on the circuit board. The first portion closes the plurality of closed perimeters to form chambers. Each of the chambers is sealed to the circuit board by conductive adhesive. Each of the chambers, where shielding is desired, includes a conductive layer covering an entire inside surface of the chamber.

Preferably, the first frame and the second frame each comprise a stepped shoulder surface for fitting against an outer edge region of a respective side of the circuit board, and an outer surface located outside of a perimeter of the circuit board. The respective outer surfaces of the first and second frames are in abutting relationship to each other when the circuit board is fit between the first frame and the second frame with the respective outer edge regions abutting the respective stepped shoulder surfaces. The facing surfaces are secured preferably by a fast adhering means, such as by plastic welding, heat setting adhesive or fast curing adhesive for holding the first frame, the circuit board, the second frame, the first portion and the second portion together as a unit. This fast securing means holds the assembly together while allowing the conductive adhesive to cure for a longer period of time.

Advantageously, the device can include at least one second electronic component mounted on the second side of the printed circuit board. The second frame can be composed of a plastic material, and comprise longitudinally arranged rails and laterally arranged rails that define at least one second closed perimeter in the plane of the circuit board that surrounds the at least one second electronic component on the circuit board. The second cover portion closes the at least one closed perimeter to form a second chamber. Preferably, a second layer of conductive material covers the inside surface of the second chamber. Preferably, the second cover portion also comprises a conductive material.

Preferably, the first cover portion and the second cover portion each comprise stamped metal plates. Each stamped metal plate has formations for integrating the stamped metal plate with the respective first and second frames when the first and second frames are over molded with the metal plates. Preferably, the formations comprise a plurality of spaced-apart holes through the stamped metal plates. Preferably, the stamped metal plates comprise elongated trough regions corresponding in extent to the longitudinally extending rails and the laterally extending rails of the respective frames. At least one of the trough regions has the spaced-apart holes therethrough. When the first and second frames are over molded onto the stamped metal plates, the first and second frames are formed through the spaced-apart holes and fill the trough regions.

Advantageously, the second frame can be configured identically to the first frame, and the second cover portion can be configured identically with the first cover portion. However this is not required as the opposite sides of the electronic device can have different component layouts and different shielding provisions.

Generally, the invention provides a shielding device for any circuit board. The shielding device includes at least one sidewall defining a closed perimeter. The closed perimeter comprises an open first face having a facing surface to be secured to a circuit board. The shielding device includes a first cover portion carried by the sidewall and closing an opposite second face of the closed perimeter, forming a chamber that is closable by being secured to a circuit board. The invention includes a conductive inside surface of the chamber. The sidewall can be composed of a plastic material. The sidewall can be molded. The sidewall can be composed of a non-conductive material with a conductive layer adhered thereto or can be composed of a conductive plastic. The first cover portion can compose a conductive material, metal or plastic, or can be a nonconductive layer adhered thereto.

Preferably, a frame defines a plurality of closed perimeters, each of the closed perimeters comprising an open first face having a facing surface to be secured to a circuit board. A plurality of first cover portions are carried by the frame and are arranged to close opposite second faces of the plurality of closed perimeters, forming a plurality of chambers each closable by the frame by being secured to a circuit board. Each chamber sidewalls and cover portion are made conductive.

Preferably, the plurality of first cover portions are formed on a single stamped metal plate. The stamped metal plate can be formed with troughs which correspond in position to portions of some of the plurality of closed perimeters of the frame. The troughs include spaced apart openings through the stamped metal plate. The frame is formed through the openings and fills the troughs to integrate the stamped metal plate with the frame. Alternately, the cover portions can have bent tabs which correspond to a portion of the closed perimeter or an interior frame wall. The tabs can be integrated with the frame by molding.

The various aspects and embodiments of the invention demonstrate the advantages of providing a cover portion and sidewall of an electronic device that includes a conductive inside surface to provide shielding for an electronic component. According to one aspect, a separate shielding element mounted beneath a device cover plate can be eliminated. A significant vertical space and lateral space can be saved to allow more room for functional electronic components. Furthermore, by compartmentalizing the device cover and frame, the casing becomes more rigid with reduced unsupported longitudinal and lateral spans across the cover. Unsupported, lengthy longitudinal and lateral spans across the cover can be more susceptible to force-induced deflection. Such deflection can lead to faults, shorts and damage to internal components.

Numerous other advantages and features of the present invention will be become readily apparent from the following detailed description of the invention and the embodiments thereof, from the claims and from the accompanying drawings.

BRIEF DESCRIPTION OF THE DRAWINGS

FIG. 3 is a diagrammatic, sectional view taken generally along line 3-3 of FIG. 1;

FIG. 4 is a fragmentary, diagrammatic, enlarged sectional view taken from FIG. 3;

FIG. 6 is a sectional view illustrating the molding of a part of the device shown in FIG. 2;

FIG. 7 is a sectional view illustrating the further step of metallizing an inner surface of the part shown in FIG. 5.

DETAILED DESCRIPTION OF THE PREFERRED EMBODIMENTS

Figure 1:
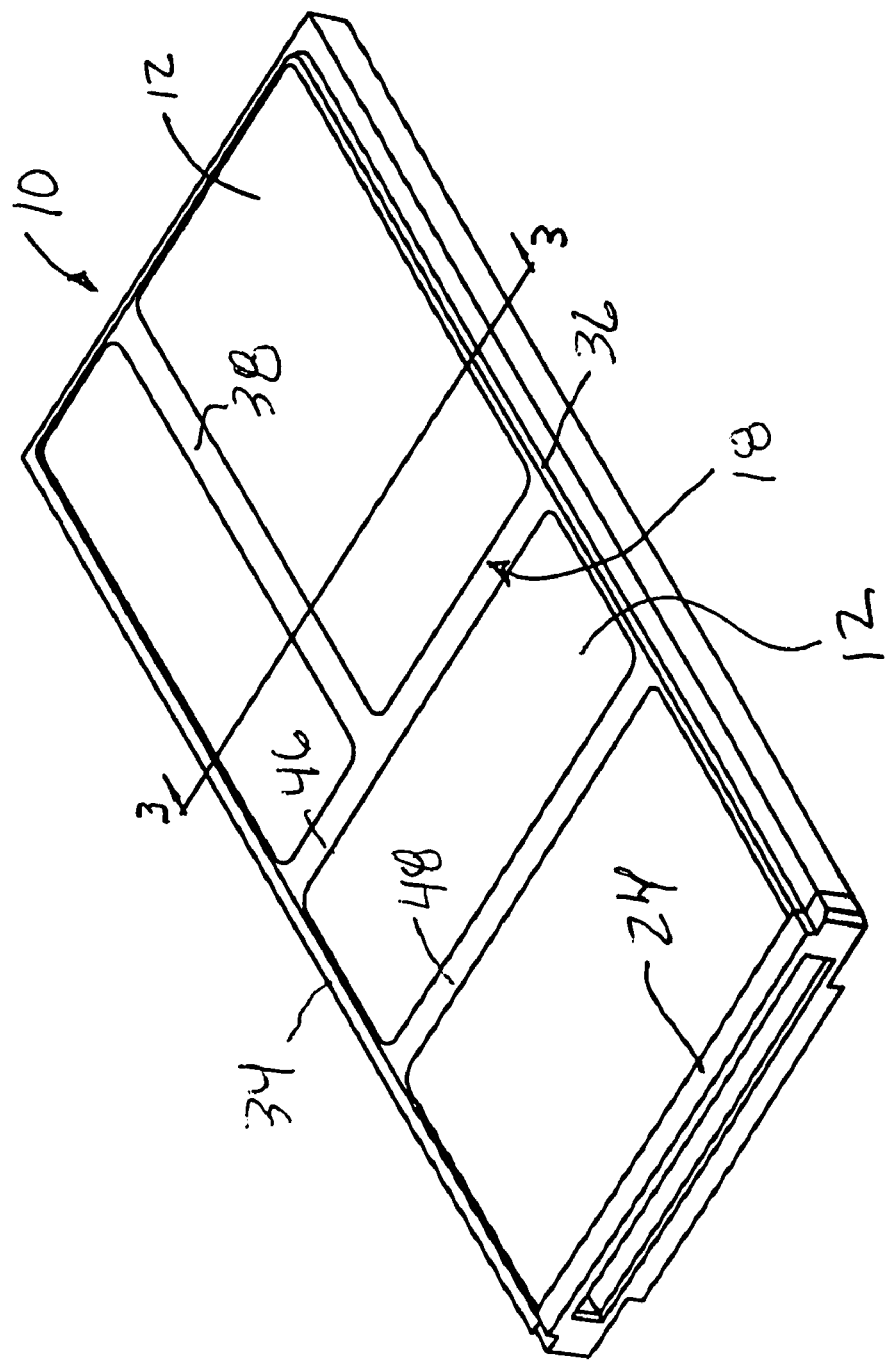
FIG. 1 is a perspective view of an electronic device incorporating the present invention.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

FIG. 1 illustrates an electronic device 10, in the form of a peripheral card, for providing an outside device (not shown), such as a computer system, with a plug-in signal processing module or memory module. The device 10 includes first and second cover portions, such as in the form of metallic top and bottom covers 12, 14, an upper frame 18, a circuit board 20 (shown in FIG. 3), a lower frame 22, and an end connector 24. The upper and lower frames 18, 22 are preferably molded plastic or polymer parts. The end connector 24 is adapted to electrically mate with a corresponding connector (not shown) of the outside device. One or more second connectors (not shown) could be provided on an end of the card opposite the end connector 24 to be adapted to mate with an exterior plug (not shown) from another outside device, such as a printer. A number of different electronic components, such as integrated circuits or computer chips and indicated generally by the reference number 28, provide specific functions and are mounted on the circuit board 20.

Figure 2:
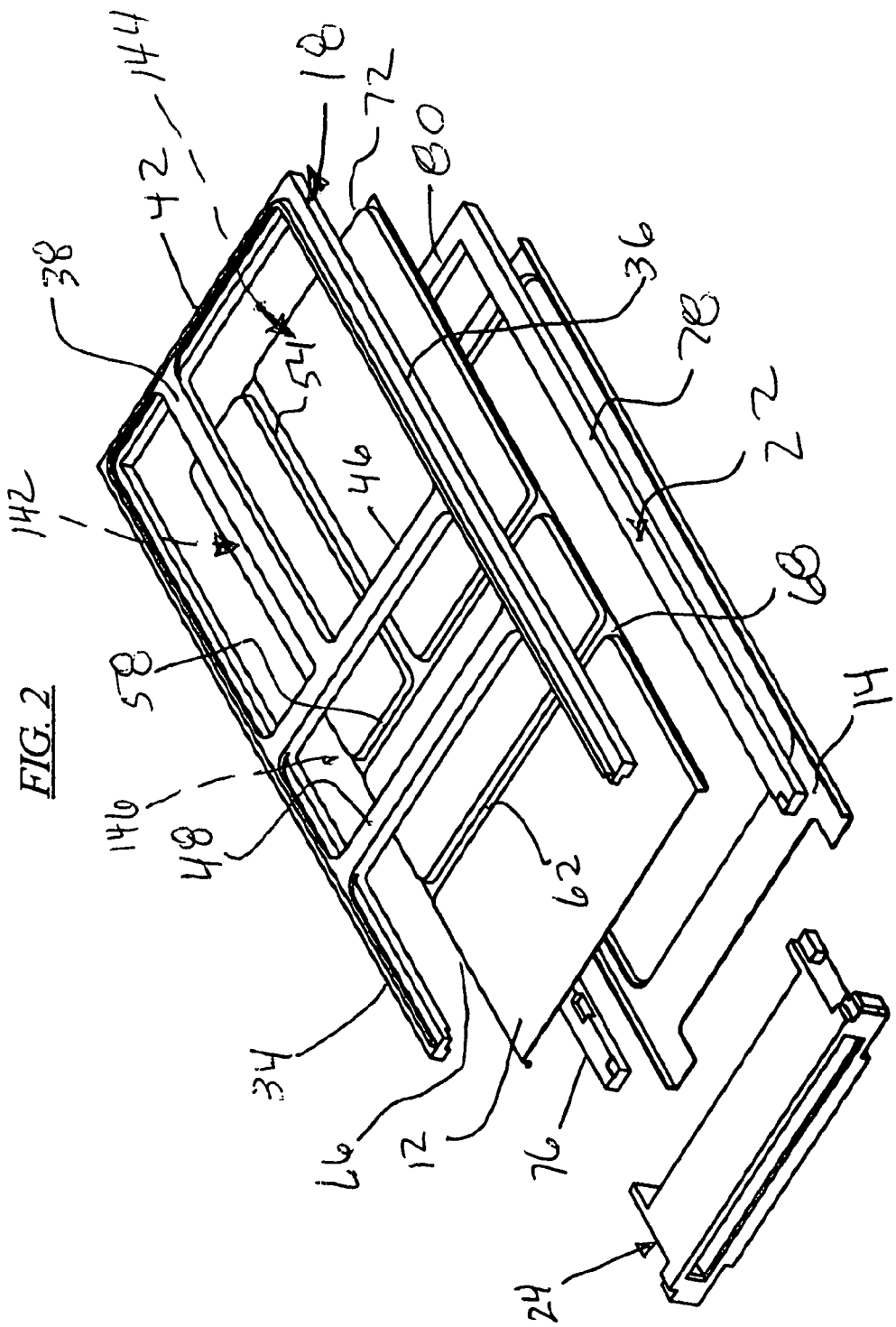
FIG. 2 is an exploded perspective view of the electronic device shown in FIG. 1, with a circuit board removed for clarity.

FIG. 2 shows the upper frame 18 includes longitudinally extending side rails 34, 36, a longitudinally extending intermediate rail 38, a laterally extending end rail 42, and laterally extending first and second intermediate rails 46, 48.

The top cover 12 includes a longitudinally extending trough 54, a first laterally extending trough 58 and a second laterally extending trough 62. The longitudinally extending trough 54 intersects the laterally extending trough 58. The troughs 54, 58, 62 are substantially the same depth. The side edges and the end edge of the cover 12 are turned down to a depth equal to the depth of the troughs 54, 58, 62, forming side ledges 66, 68 and an end ledge 72.

The bottom cover 14 can have a raised plain wall as shown in FIG. 2 or can include troughs such as shown formed in the top cover 12, or can have a different pattern of troughs than the top cover 12. The bottom frame 22 includes side rails 76, 78 and an end rail 80 that at partly define a perimeter of the frame 22.

Figure 5:
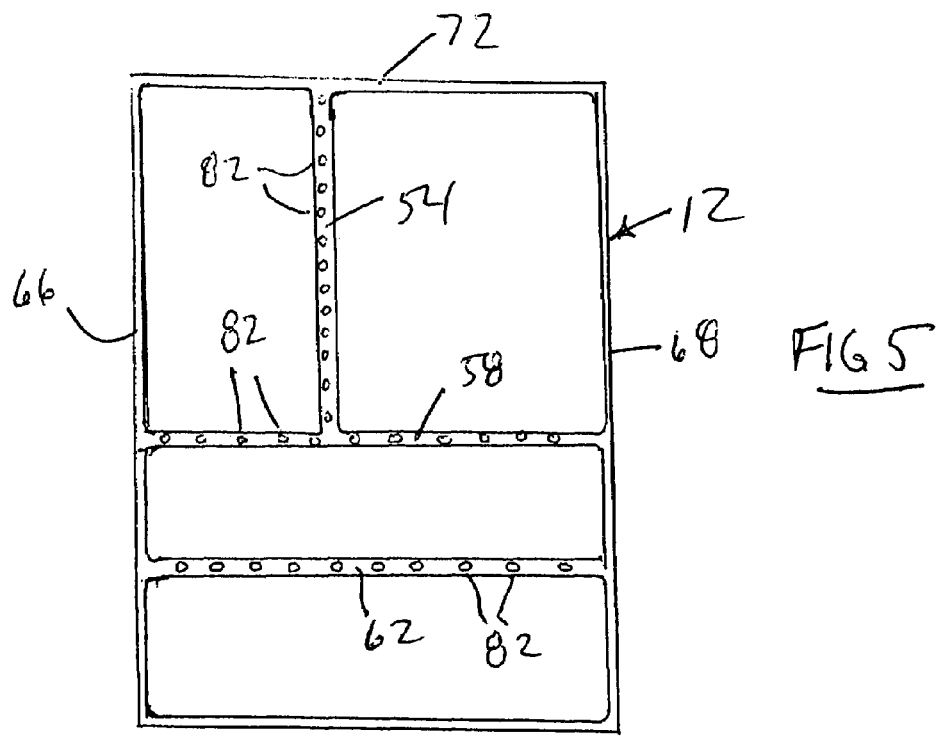
FIG. 5 is a plan view of a metal cover plate.
Figure 8:
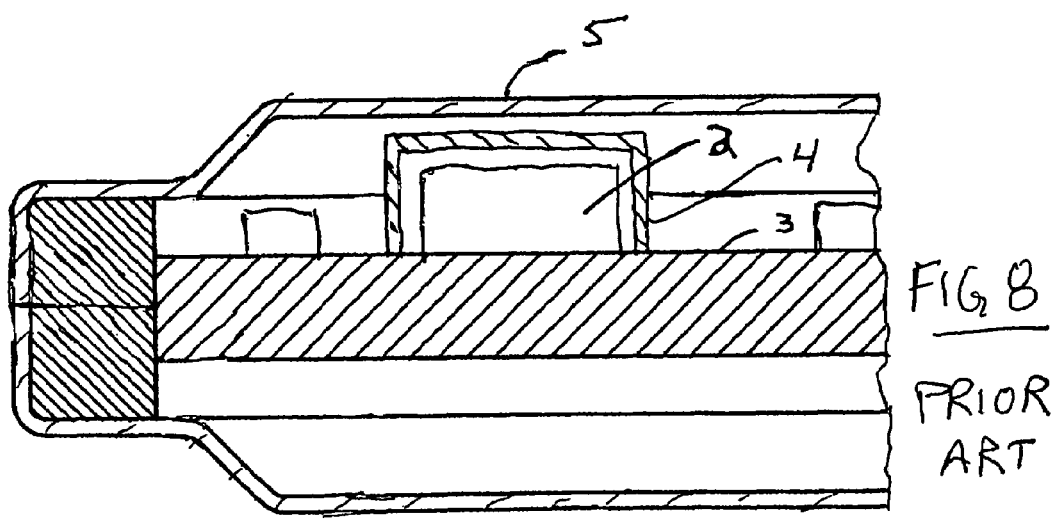
FIG. 8 is a diagrammatic, sectional view of a prior art peripheral device construction.

FIG. 5 illustrates the top cover 12 and further illustrates that the troughs 54, 58, 62 include a plurality of holes 82.

FIGS. 3 and 4 illustrate a cross-section of the structure of the invention. The top cover 12 is integrated with the upper frame 18, and the bottom cover 14 is integrated with the bottom frame 22. The ledges 66, 68 of the top cover 12 are embedded into the rails 34, 36 respectively. The end ledge 72 is embedded into the end trough 42 in the same fashion (not shown). The bottom cover has side and end ledges that are embedded into the rails 76, 78, 80 in the same fashion as the top cover 12 is embedded into the rails 34, 36, 42.

The longitudinally extending intermediate rail 38 is integrated with the trough 54 by the rail 38 being formed above and below the trough 54 and filling the trough 54 and the holes 82. The rails 46, 48 are integrated with the troughs 58, 62 respectively in the same fashion as the rail 38 is integrated with the trough 54, by being formed above and below the troughs 58, 62 and filling the troughs 58, 62 and the holes 82 therethrough.

The bottom frame 22 can be a raised plain frame as shown in FIGS. 2 and 3 or can include longitudinally extending side and intermediate rails and lateral rails of the same pattern as the upper frame 18, or of a different pattern. An intermediate rail 38 is shown dashed in FIG. 3. The rails of the bottom frame 22 can be integrated to the bottom cover 14 in the same fashion as the rails of the upper frame 18 are integrated to the top cover 12.

FIG. 4 shows that a sidewall conductive layer 110, composed of a conductive material, covers an inside surface of the frame 18 and a bottom surface of the rails 34, 38 above the circuit board 20. A cover conductive layer 116, composed of a conductive material, covers an inside surface of the top cover 12. The layers 110 and 116 are preferably formed at the same time of the same material and are continuous.

In the present specification, the term conductive refers to being electrically conductive.

The side rails 34, 36 and the end rail 42 (not shown) of the upper frame 18 all include a stepped recess 120 for receiving a top edge portion of the circuit board 20. The side rails 76, 78 and the end rail 80 (not shown) of the bottom frame 22 all include a stepped recess 124 for receiving a bottom edge portion of the circuit board 20 in the same fashion. An electrically conductive adhesive 128 is applied between the surfaces 120 and 124 and the circuit board 20. Preferably, the electrically conductive adhesive 128 is applied between all of the rails 34, 36, 38, 42, 46, 48 and the circuit board. Electrically conductive adhesive 128 is applied between the rails 76, 78, 80 and the circuit board 20. If further longitudinal and lateral rails are provided on the bottom frame, electrically conductive adhesive is applied between such rails and a bottom surface of the circuit board. The side rails 34, 76, the side rails 36, 78 and the end rails 42, 80 provide facing surfaces 132, 134 outside the outer perimeter of the circuit board. The facing surfaces 132, 134 are secured together by a fast setting securing means such as a plastic weld, a sonic weld, a fast setting adhesive, a thermally setting adhesive, or the like, all indicated as the layer 136.

The rails 34, 42, 38, 46 create a closed perimeter in the plane of the circuit board which is then closed at a top face by the cover 12, forming a chamber 142. The conductive layers 110, 116 cover the inside surfaces of the rails 34, 42, 38, 46 and the inside surfaces of the cover 12. By the conductive layer being adhered to, and covering, the inside surface of the chamber 142, the chamber 142 forms an effective shielding for one or more electronic components 28 within the chamber 142. Likewise, the rails 38, 42, 36, 46 and cover 12 form a chamber 144. The conductive layers 110, 116 cover the inside surfaces of the rails 38, 42, 36, 46 and the inside surfaces of the cover 12. The conductive layer 110, 116 adhered to, and covering, the inside surface thereof forms an effective shielding for electronic component 28 within the chamber 144. The rails 34, 46, 36, 48 and the cover 12 form a chamber 146. The conductive layer 110, 116 adhered to, and covering, the inside surface thereof forms an effective shielding for electronic component 28 located within the chamber 146.

Thus, electronic components can be arranged within these separate shielded chambers 142, 144, 146 without the need for individual shields for electronic components to be applied within beneath the cover 12.

The conductive adhesive 128 beneath the shielded chambers can be arranged to make contact with a ground contact on the circuit board.

Although laterally and longitudinally extending rails and troughs are illustrated and described which form the closed perimeters for forming shielding chambers, the invention also encompasses curved rails, circular rails portions, or other shapes that can define a closed perimeter. The invention is not limited to longitudinally and laterally extending rails to form the closed perimeters.

Likewise, shielded chambers can be formed on a bottom side of the circuit board 20 utilizing the frame 22, the cover 14 and additional rails and troughs, and an inside surface conductive layer.

Materials of construction for the electronic device could be polycarbonate or a polycarbonate/ABS blend for the frames 18, 22; conventional sheet metal for the stamped metal covers 12, 14; and nickel, copper, aluminum or other conductive material for the inside conductive layer 110, 116.

Also, by compartmentalizing the top cover 12 with the troughs 54, 58, 62, and the upper frame 18 with the rails 38, 46, 48 the lateral and longitudinal unsupported span of the cover 12 is significantly reduced. Forced deflection by a pressing force on the cover 12 is reduced compared to the prior art cover having substantially unsupported width and length. Therefore, an electrical fault or short between the cover and an internal component is less likely to occur due to a pressing down of, and a deflection of, the cover 12.

FIG. 6 illustrates, in a diagrammatic or schematic fashion, a method of securing the cover 12 to the frame 18. The cover 12 is placed into a mold cavity 160 defined between a female mold half 162 and a mating male mold half 164. Molten plastic is injected under pressure through one or more nozzles 166, through one or more sprues or channels 168 and into the cavity 160. The molten plastic fills cavity regions corresponding to the side and end rails 34, 36, 42 wherein the ledges 66, 68, 72 are embedded by the plastic of the side and end rails 34, 36, 42. The molten plastic fills the cavity regions corresponding to the remaining rails 38, 46, 48 and the respective troughs 54, 58, 62 via the holes 82. Once the plastic solidifies, the frame 18 of the cover 12 are integrated and fixed together.

FIG. 7 illustrates a subsequent method of applying the conductive layers 110, 116 to the inside surfaces of the frame 18 and the cover 12. The frame 18 and the cover 12, now as a single part, are held by a holder 172 in a reactor, or plating chamber 174 within a vessel 176. The frame and cover part is held by the holder by a known mechanism such as clamps, grippers or a vacuum grip (not shown). The vessel 176 includes an evacuation channel 178, as is known. A selected metal target or supply 180 is held within the chamber and heated. The 176 vessel is evacuated to a pre-selected vacuum. The metal released from the target 180 forms the layer 110, 116 on the frame 18 and cover 12. The thickness of the layer 110, 116 is kept to a minimum. Advantageously, the thickness of the layer is about 2-3 microns. To ensure a uniform deposition, the holder can rotate the frame and cover part during deposition.

The particular details of vacuum deposition methods and apparatus are well known, such as disclosed in U.S. Pat. Nos. 4,022,928; 4,306,515; 4,777,908; 6,274,014; and 6,855,236, herein incorporated by reference.

FIGS. 9-15 describe an alternate embodiment shield 200 mounted on a circuit board 204. The shield 200 can be clamped to the board 204 by one or more clamps 210 (shown dashed) or adhesively secured by a layer of electrically conductive adhesive 214.

Figure 10:
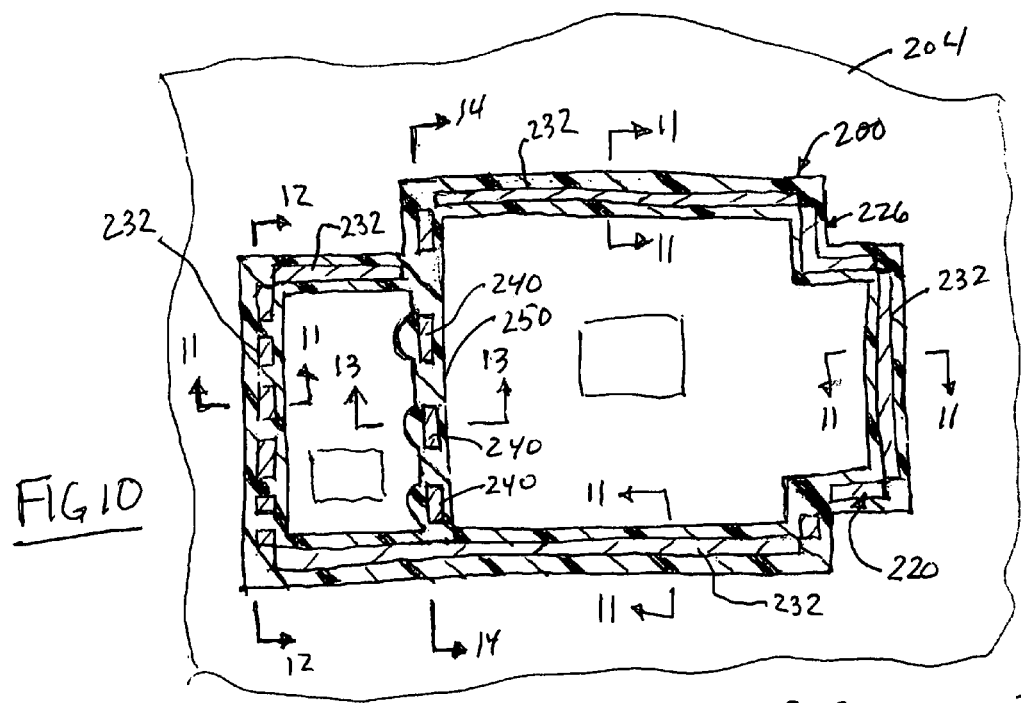
FIG. 10 is a sectional view taken generally along line 10-10 of FIG. 9.
Figure 9:
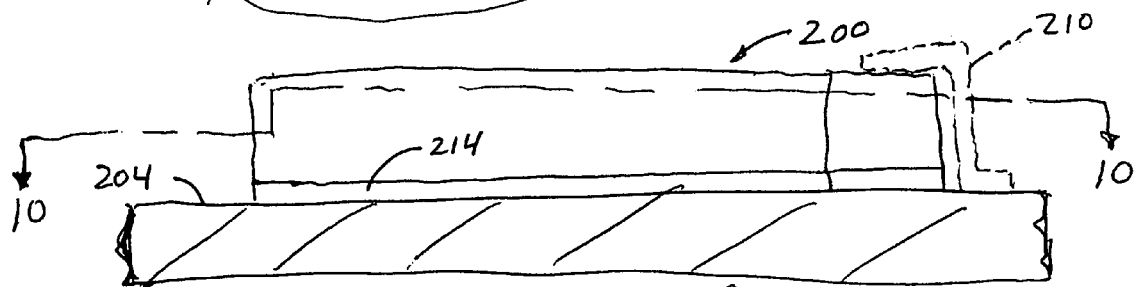
FIG. 9 is an elevation view of an alternate embodiment of the invention.
Figure 11:
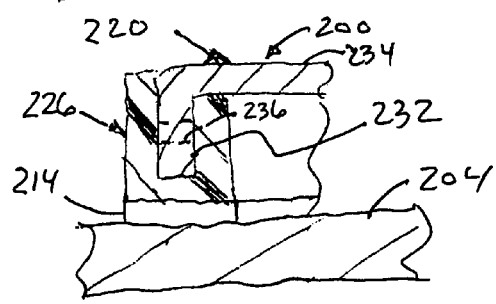
FIG. 11 is a fragmentary sectional view taken generally along line 11-11 in FIG. 10.
Figure 13:
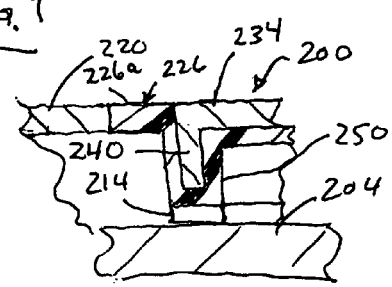
FIG. 13 is a fragmentary sectional view taken generally along line 13-13 in FIG. 10.
Figure 12:
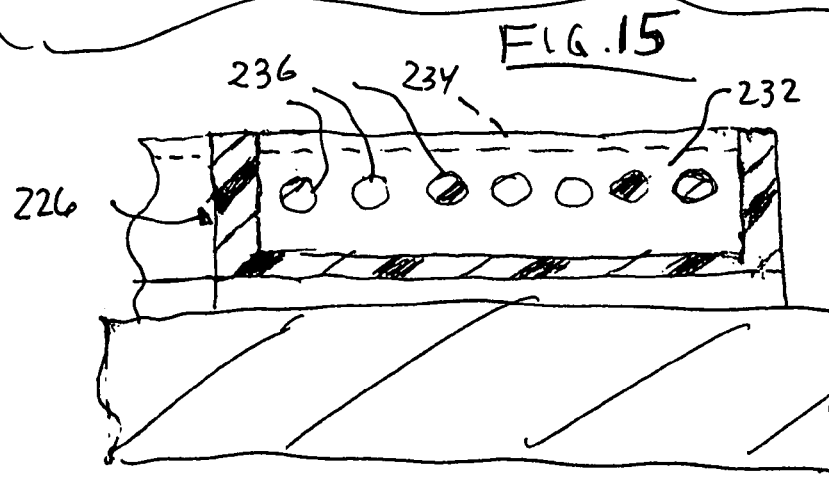
FIG. 12 is a fragmentary sectional view taken generally along line 12-12 in FIG. 10.
Figure 14:
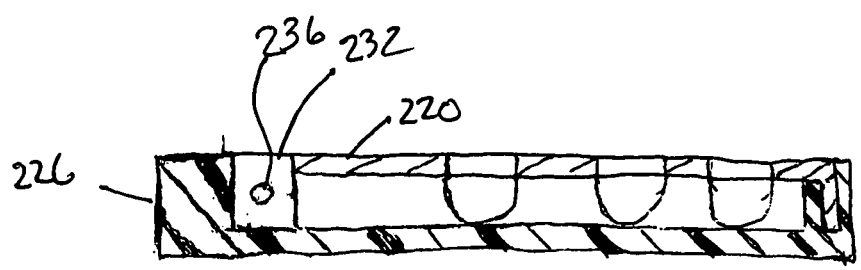
FIG. 14 is a fragmentary sectional view taken generally along line 14-14 in FIG. 10.

As shown in FIGS. 10-15, the shield 200 includes a stamped, electrically conductive metal cover 220 and a molded frame 226 integrated with the cover 220. The cover 220 includes a surrounding sidewall 232 bent down from a top plate 234 of the cover 220. The surrounding sidewall 232 includes a plurality of closely spaced holes 236 (FIG. 12). The cover 220 also includes interior tabs 240 that are bent down perpendicularly from the top plate 234, arranged in a line.

Figure 15:
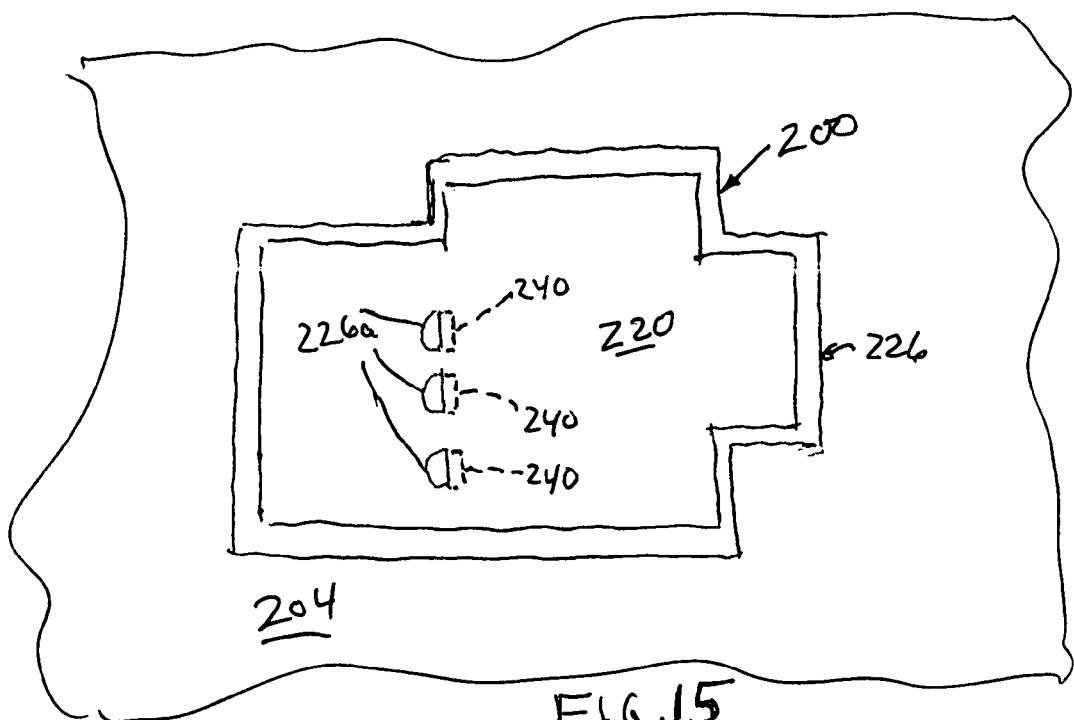
FIG. 15 is a plan view of the embodiment of FIG. 9.

The cover 220 is integrally molded with the frame 226. Frame material encapsulates the surrounding sidewall 232 inside and out, as shown in FIG. 11. Frame material penetrated into the holes 236 to lock the frame to the sidewall 232. An interior wall 250 is formed to encapsulate the tabs 240 as shown in FIG. 10. The tabs lock the cover 220 to the interior wall 250. Portions 226a of the frame 226 penetrate through the holes left by the bent down tabs 240, and are visible on top of the shield (FIG. 15).

The frame material is composed of electrically conductive plastic. Such plastic typically includes an electrically conductive additive. The cover can be a cold rolled steel or other electrically conductive metal.

To form the shield 200, first the cover 220 is stamped forming the top plate 234, the side wall 232 with holes 236 and the tabs 240 in a flat plane. Next, the flat plane is bent into the shape of the cover 220 having downwardly bent sidewall 232 and downwardly bent tabs 240. The sidewall 232 can be discontinuous at each corner due to the process of forming the sidewall 232. Next, the cover 220 is placed into a mold having a cavity that is shaped corresponding to the extent and contours of the desired frame 226. Molten electrically conductive plastic is injected into the cavity to form the frame 226 integrated with the cover 220.

From the foregoing, it will be observed that numerous variations and modifications may be effected without departing from the spirit and scope of the invention. It is to be understood that no limitation with respect to the specific apparatus illustrated herein is intended or should be inferred.

The invention claimed is:

1. An electronic device, comprising:
   a circuit board and an electronic component mounted to a first side of said circuit board;
   a first frame composed of a molded material and secured around its perimeter to said first side of said circuit board, and comprising a plurality of longitudinally arranged rails and laterally arranged rails defining at least one closed perimeter that surrounds said electronic component on said circuit board;
   a metal first cover portion carried by said first frame and closing said at least one closed perimeter, forming a chamber;
   a layer of conductive material adhered to and covering an inside surface of said closed perimeter and said metal first cover portion;
   a second frame, secured around its perimeter to an opposite side of said circuit board, and comprising a plurality of longitudinally extended rails and laterally extending rails at least partially defining a perimeter of said second frame; and
   a metal second cover portion carried by said second frame and closing said second frame.

2. The device according to claim 1, wherein said layer of conductive material extends continuously from said inside surface of said closed perimeter onto an inside surface of said metal first cover portion, covering said metal first cover portion.

3. The device according to claim 2, wherein said first frame is adhesively secured to said first side of said circuit board with electrically conductive adhesive.

4. The device according to claim 3, wherein said first frame comprises a plurality of closed perimeters each of which surrounds an electronic component mounted on said circuit board, and wherein said metal first cover portion closes said plurality of closed perimeters, and wherein each of said closed perimeters are sealed to said circuit hoard by conductive adhesive.

5. The device according to claim 4, wherein said first frame is adhesively secured to said first side of said circuit board with electrically conductive adhesive, and wherein said first frame and said second frame each comprise a stepped shoulder surface for fitting against an outer edge region of a respective side of said circuit board, and an outer surface located outside of a perimeter of said circuit board, said respective outer surfaces being in abutting relationship when said circuit board is fit between said upper frame and said bottom frame with said respective outer edge regions abutting said respective stepped shoulder surfaces, wherein said facing surfaces are secured by a fast adhering means for holding said upper frame, said circuit board, said bottom frame, said first cover portion and said second cover portion together as a unit while allowing said conductive adhesive to cure for a longer period of time.

6. The device according to claim 1, wherein said first frame is configured identically to said second frame, and said first cover portion is configured identically with said second cover portion.

7. The device according to claim 1, comprising:
   at least one second electronic component mounted on said second side of said circuit board, wherein said second frame is composed of a molded material, and comprising longitudinally arranged rails and laterally arranged rails that define at least one second closed perimeter that surrounds said at least one second electronic component on said circuit board;
   said second cover portion closing said at least one closed perimeter, forming a second chamber; and
   a second layer of conductive material adhered to and covering an inside surface of said second chamber.

8. The device according to claim 7, wherein said second layer of conductive material extends continuously from said inside surface of said second closed perimeter onto an inside surface of said second cover portion, covering said second cover portion.

9. The device according to claim 4, wherein said metal first cover portion comprises a stamped metal plate, said stamped metal plate having formations for integrating said stamped metal plate with said first frame when said first frame is over molded onto said metal plate.

10. The device according to claim 9, wherein said formations comprise a plurality of spaced-apart holes through said stamped metal plate.

11. The device according to claim 10, wherein said stamped metal plate comprises elongated trough regions corresponding in extent to portions of said longitudinally extending rails and said laterally extending rails, and at least one of said trough regions having said spaced-apart holes therethrough, and when said first frame is over molded onto said stamped metal plate, said first frame is formed through said spaced-apart holes and fills said trough region.

* * * * *